United States Patent

Wakamatsu et al.

[11] Patent Number: 5,086,278
[45] Date of Patent: Feb. 4, 1992

[54] CIRCUIT ELEMENT MEASURING METHOD AND APPARATUS

[75] Inventors: Hideki Wakamatsu; Shinya Goto, both of Tokyo, Japan

[73] Assignee: Hewlett-Packard Company, Palo Alto, Calif.

[21] Appl. No.: 659,853

[22] Filed: Feb. 22, 1991

[30] Foreign Application Priority Data

Feb. 27, 1990 [JP] Japan .................................. 2-49052

[51] Int. Cl.⁵ .............................................. G01R 27/00
[52] U.S. Cl. ........................... 324/605; 324/650; 324/613; 330/149
[58] Field of Search ............... 330/149; 324/605, 609, 324/611, 613, 614, 649, 650, 123 R, 115

[56] References Cited

U.S. PATENT DOCUMENTS

| | | | |
|---|---|---|---|
| 4,264,871 | 4/1981 | Forward | 330/149 |
| 4,496,909 | 1/1985 | Knapp | 330/149 |
| 4,577,160 | 3/1986 | Lettvin | 330/149 |
| 4,905,308 | 2/1990 | Davidson | 324/613 |

FOREIGN PATENT DOCUMENTS 0058307  3/1986  Japan .................................. 330/149

OTHER PUBLICATIONS

Hashimoto: "An Automatic Wide-Range Digital LCR Meter"—HP Journal, Sep. 1976.

Primary Examiner—Kenneth A. Wieder
Assistant Examiner—Jose M. Solis
Attorney, Agent, or Firm—Woodcock Washburn Kurtz Mackiewicz & Norris

[57] ABSTRACT

The circuit element being measured is connected to a signal source, a volt meter, a zero detection amplifier and a voltage controlled current source for drawing an electric current through the device to be measured in accordance with the output of the zero detection amplifier. Means are provided for changing the operating point of the zero detection amplifier in response to a measuring condition of the apparatus.

13 Claims, 3 Drawing Sheets

CIRCUIT ELEMENT MEASURING METHOD AND APPARATUS

FIELD OF THE INVENTION

The present invention relates to a method and apparatus for high accuracy circuit element measurements by providing the best operating condition of the measurement system.

BACKGROUND OF THE INVENTION

Figure 1:
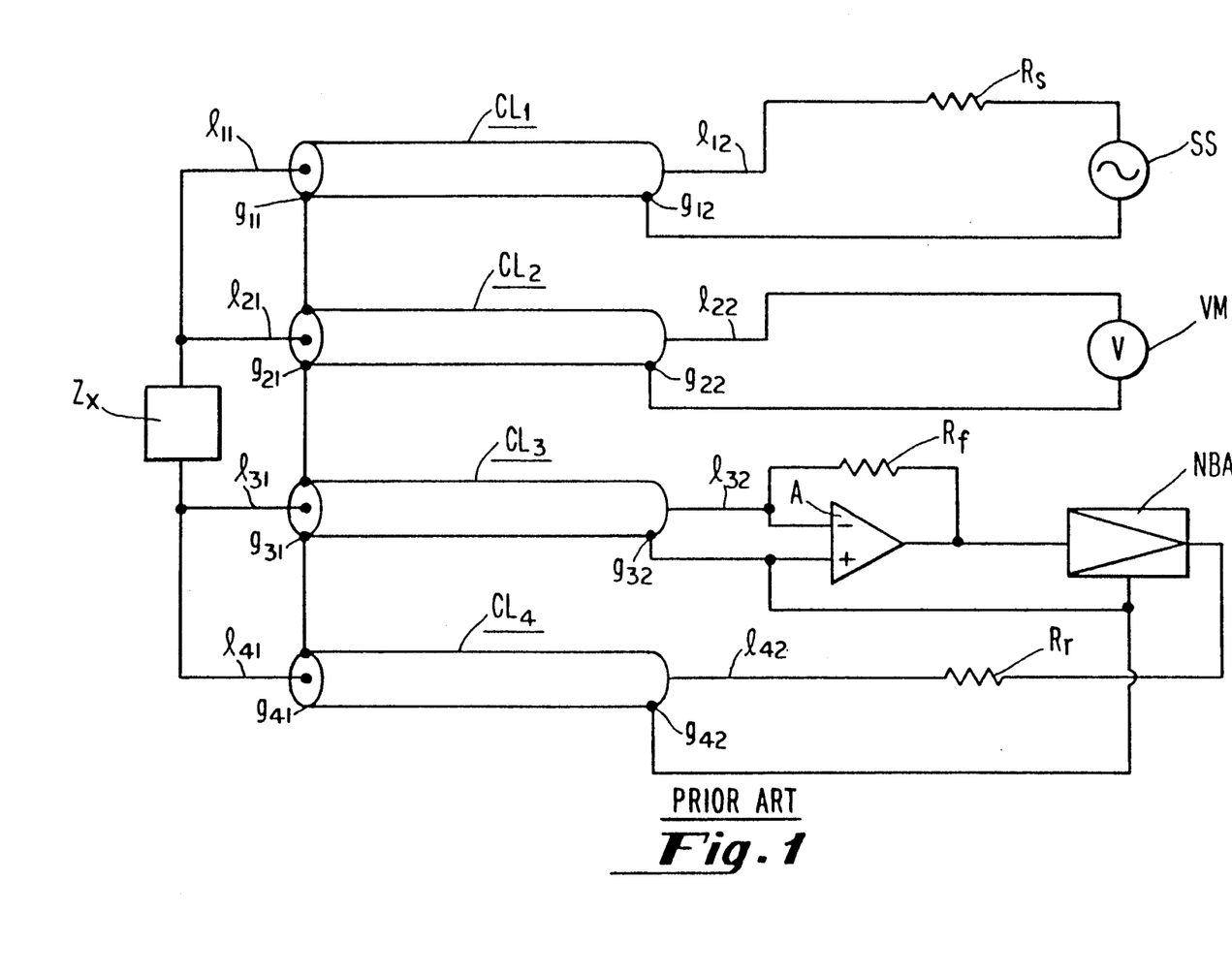
FIG. 1 is a schematic circuit diagram showing the circuit element measuring apparatus according to the prior art.

Demands for high-precision measurements of a circuit element are increasing annually. The apparatus for such measurements is exemplified by the "Multi-Frequency LCR meter 4274A or 4275A" which is commercially available from Yokogawa-Hewlett-Packard for use in four-terminal measurements. FIG. 1 is a schematic circuit diagram showing a circuit element measuring apparatus for four-terminal pair measurements according to the prior art.

By means of four terminal lines $CL_1$, $CL_2$, $CL_3$, and $CL_4$ providing four terminal pairs, a circuit element to be measured (hereinafter referred to as a "DUT" or element $Z_x$) is connected to a signal source SS, a volt meter VM, a range resistance $R_r$ and a zero detection amplifier A which together form a measuring apparatus. The impedance value of the element $Z_x$ shall also be referred to as $Z_x$.

The lines $CL_1$, $CL_2$, $CL_3$ and $CL_4$ are generally made of coaxial cables although not limited thereto, and their outer conductor terminals $g_{11}$, $g_{21}$, $g_{31}$ and $g_{41}$ at one end thereof are connected to one another and held at the same potential. The terminals $l_{11}$ and $l_{21}$ of the center conductor of the lines $CL_1$ and $CL_2$ at the same end thereof are connected to one terminal of the element $Z_x$. The terminals $l_{31}$ and $l_{41}$ of $CL_3$ and $CL_4$ are connected to the other terminal of the element $Z_x$. The terminals of the center conductors of the lines $CL_1$, $CL_2$, $CL_3$ and $CL_4$ and the outer conductor at the opposite end (i.e. at the side on the meter) are respectively designated as $l_{22}$, $g_{12}$, $l_{22}$, $g_{22}$, $l_{32}$, $g_{32}$, $l_{42}$ and $g_{42}$.

Between the terminals $l_{12}$ and $g_{12}$, the signal source SS and a signal source resistance $R_s$ are connected in series. The volt meter VM is connected between the terminals $l_{22}$ and $g_{22}$. The terminals $l_{32}$ and $g_{32}$ are respectively connected to the inverted input terminal and non-inverted input terminal of the zero detection amplifier A. The feedback resistance $R_f$ is connected between the inverted input terminal and the output terminal of the zero detection amplifier A. The output of the zero detection amplifier A is introduced into a narrow-band amplification/phase compensation amplifier NBA. The output of the NBA is applied through the range resistance $R_r$ to the terminal $l_{42}$. The NBA is similar to that used in the aforementioned meters 4274A and 4275A. The range resistance $R_r$ is placed between the terminal $l_{42}$ and the NBA output, and the terminals $g_{42}$ and $g_{32}$ are also connected.

In the circuit of FIG. 1, an automatic control is performed on the voltage between the terminals $l_{32}$ and $g_{32}$, i.e., controlled such that the current flow through the terminal $l_{32}$ may be substantially zero. As a result, a voltage $V_x$ to be applied to the element $Z_x$ is obtained as the indication of the volt meter VM. Moreover, a current $I_x$ to flow through the element $Z_x$ is obtained as an indication of the range resistance $R_r$. Since a complex voltage and a complex current are measured at the volt meter VM and the range resistance $R_r$ with reference to the detected output of the signal source SS, the value $Z_x$ is determined in a complex value in accordance with the following equation:

$$Z_x = V_x/I_x = V_x R_r/V_i \tag{0}$$

wherein $V_i$ is equal to the voltage generated across the $R_r$ and is expressed as $$V_i = I_x R_r.$$

The method of measuring the complex voltage or current is well known in the art and is used together with the overall operations of the meter in the aforementioned 4274A or 4275A. The calibrations are carried out by the known method of replacing the measured element with a "short" or "open" or by using a known third impedance.

It will be understood that the range resistance $R_r$ is selected to have a magnitude close to that of the $Z_x$. This provides the advantage of a uniform dynamic range for succeeding volt meters by making the magnitudes of the $V_x$ and $V_i$ same.

It will also be understood that the stabilization of the automatic control loop composed of the line $CL_3$, the zero detection amplifier A, the NBA, the range resistance $R_r$ and the line $CL_4$ can be made excellent by selecting a sufficiently small value of the feedback resistance $R_f$.

Figure 2:
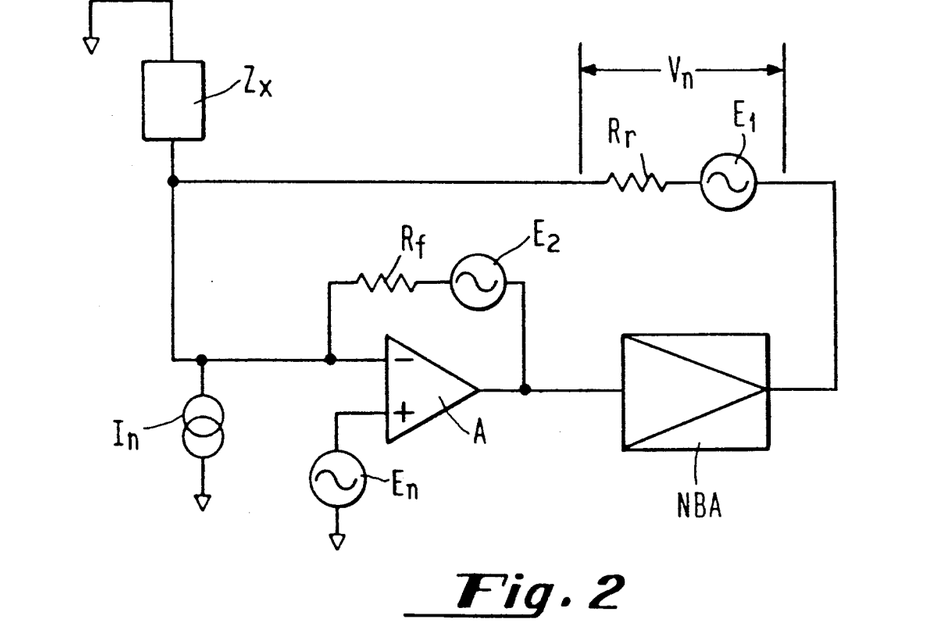
FIG. 2 is a diagram for explaining the noise mode of FIG. 1.

Reference will now be made to FIG. 2 wherein a noise model of the automatic control loop of FIG. 1 is shown so as to provide an understanding of the problem of noise in the prior art thus far described. Referring to FIG. 2, reference characters $E_1$ and $E_2$ designate the thermal noise of the resistors $R_r$ and $R_f$ respectively; and characters $E_n$ and $I_n$ designate an equivalent input noise voltage and an equivalent input noise current of the zero detection amplifier A respectively. These four noise sources are deemed to be random and therefore have no correlation among themselves. Moreover, the individual noise sources are considered as white noise sources, as will be expressed by the following theoretical equations.

$$E_1 = \sqrt{(4kT \cdot R_r \cdot \Delta f)} \tag{1}$$

$$E_2 = \sqrt{(4kT \cdot R_f \cdot \Delta f)} \tag{2}$$

wherein:
k is Boltzmann's constant = $1.38 \times 10^{-23}$ [W s/K];
T is absolute temperature [K]; and
f is observation band width [Hz].

In case the amplification element at the first stage of the zero detection amplifier A is a bipolar transistor ($BT_4$), $$E_n = \sqrt{(2q \cdot I_c \cdot re \cdot \Delta f)} \tag{3}$$

$$I_n = \sqrt{(2q \cdot I_c \cdot \Delta f/h_{FE})} \tag{4}$$

wherein:
re is $kT/(q \cdot I_c)$, $kT/q$ = 25 mV (T = 300 K);
q is electron charge = $6.02 \times 10^{31\ 19}$ [C];
$I_c$ is collector current [A]; and $h_{FE}$ is short-circuit current gain.

In case the first-stage amplification element of the amplifier A is a field effect transistor (i.e., FET), $$E_n = \sqrt{(4kT(2/(3g_m))f\Delta)} \quad (5)$$

wherein $g_m$ is mutual conductance [S] of the FET. The value $I_n$ can usually be ignored.

If a volt meter VI is one for measuring the voltage $V_i$, the summation $V_n$ of the noise measured by the volt meter VI is deduced in the following form because the individual noise sources have no correlation:

$$V_n^2 = E_1^2 + (R_r E_2/R_f)^2 + (R_r I_n)^2 + (R_r E_n/(Z_x//R_f))^2 \quad (6)$$

wherein, $x//y$ is the parallel connection $xy/(x+y)$. From Equation (6), it is found that the $V_n^2$ increases more the smaller $R_f$ is as compared with $R_r$ in the case of $R_r < Z_x$. It is, therefore, advisable that the R, should not be less than the $R_r$.

In order that an increase of the summation $V_n$ because of the noises $E_n$ and $I_n$ of the amplifier A may not be more than 3 dB, the two terms of the latter half of the Equation (6) must not be larger than the two terms of the former half:

$$(R_r I_n)^2 + (R_r E_n/(Z_x//R_f))^2 < E_1^2 + (R_r E_2/R_f)^2 \quad (7)$$

Since the values $E_n$ and $I_n$ of the Equation (7) provide no simultaneous major causes of noise, the following necessary conditions are obtained by setting $I_n + O$ or $E_n + O$:

$$E_n^2 < ((Z_x//R_f)/R_r)^2 (E_1^2 + (R_r E_2/R_f)^2) \text{ (Voltage Noise Condition)} \quad (8)$$

$$I_n < (1/R_r)^2 (E_1^2 + (R_r + E_2/R_f)^2) \text{ (Current Noise Condition)} \quad (9)$$

Although FETs have a sufficiently small $I_n$ but few FETs have a smaller $E_n$ than 2nV/ (Hz) and an FET is less suitable than the $BT_r$ (i.e., bipolar transistor) for the measurement of the DUT of a lower impedance because of higher DC bias current is needed.

By using the relations among Equations (1) to (4), (8) and (9), the bias conditions for the $BT_r$ may be determined as follows:

$$25mV/2 \times (R_r//R_f)/(Z_x//R_f) < I_c < 2 \times 25mV \times h_{FE}/(R_r//R_f) \quad (10)$$

If a DUT having $Z_x = 50\Omega$, for example, is to be measured, a suitable setting is $R_r = R_f 50\Omega$ for reasons previously described. If a $BT_r$ having $h_{EF} = 100$ is used at the first stage of the amplifier A, the following relations are obtained from Equation (10) so that the noises of the amplifier A may not increase the $V_n$ to 3 dB or more.

$$0.5mA < I_c < 200mA \quad (11)$$

Likewise, the following relations are obtained if a $BT_r$ having $h_{FE} = 100$ is used at the first stage of the amplifier A for the measurements of $Z_x = 1\Omega$ and $R_r = R_f = 10K\Omega$:

$$0.0025mA < I_c < 1mA \quad (12)$$

As can be found from Equations (11) and (12) optimum value for the bias current $I_c$ of the amplification element at the first stage of the amplifier A is different for the case, in which a DUT of a low impedance is to be measured, and for the case in which a DUT of a high impedance is to be measured. In the prior art, the bias current $I_c$ uses a fixed value but not the proper value.

Next, the slew rate of the amplifier A is to be considered. In FIG. 1, it is necessary for the convergence of the aforementioned automatic control loop that the input voltage of the amplifier A be sufficiently close to zero. When the DUT is to be measured with a high measurement frequency and/or a large measurement current, the change of the $I_x$ per unit time is enlarged. If the slew rate of the amplifier A becomes smaller, the amplifier A cannot absorb more than a portion of the $I_x$. Then, the automatic control loop may perform in a nonlinear fashion and fail to converge.

The output voltage $V_o$ of the amplifier A can be expressed as the following function of time t.

$$V_o = (\sqrt{2}) I_x \cdot R_f \cdot \sin(2\pi ft) \quad (13)$$

wherein:

$I_x$ is measured current (rms);

f is measurement frequency.

When the output voltage $V_o$ is differentiated with time, $$dV_o/dt = (\sqrt{2}) \cdot 2\pi f \cdot I_x \cdot R_f \cos(2\pi ft) \quad (14)$$

The slew rate of the amplifier A has to be larger than the maximum $$(\sqrt{2}) \cdot 2\pi f \cdot I_x \cdot R_f.$$

Figure 3:
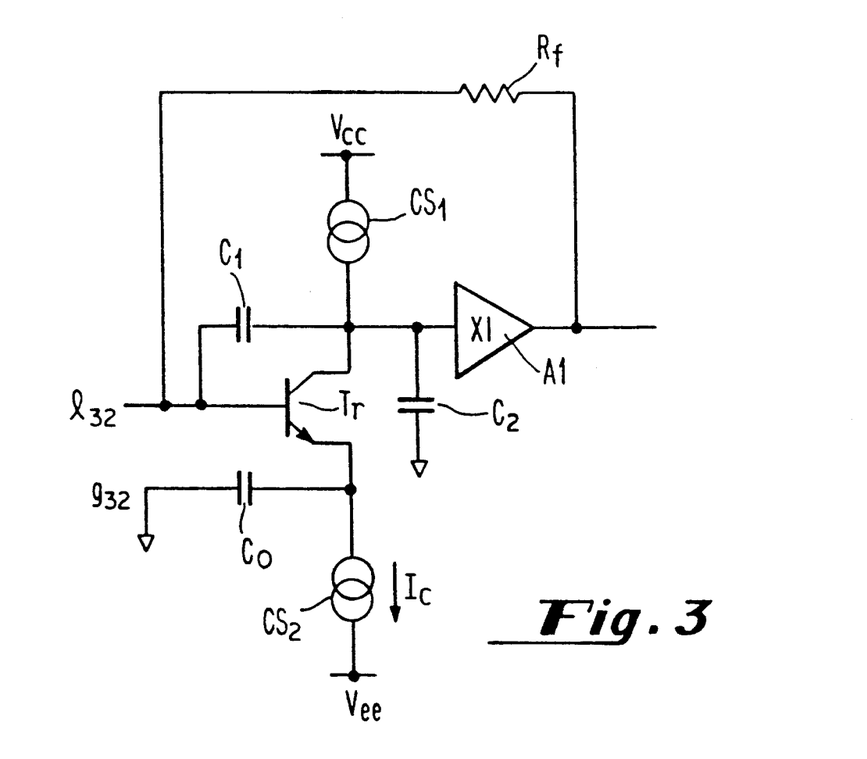
FIG. 3 is a schematic diagram showing one embodiment of the amplifier A of FIG. 1.

FIG. 3 is a more detailed circuit diagram of the amplifier A. In FIG. 3, the transistor $T_r$ has its collector and emitter connected with power sources $V_{cc}$ and $V_{ee}$ through current sources $CS_1$ and $CS_2$ of the prior art, respectively. The emitter of the transistor $T_r$ is further connected through a bypass capacitor $C_o$ with the terminal $g_{32}$ (at ground). The base of the transistor $T_r$ is the inverted input terminal of the amplifier A. A base-collector capacitor $C_1$ and an output capacitor $C_2$ are parasitic to the transistor $T_r$. The output of the amplifier A is led out from the collector of the transistor $T_r$ through a buffer amplifier $A_1$. The slew rate of the circuit of FIG. 3 is determined by the transistor $T_r$ and the peripheral circuit, as follows.

$$SR = I_c/C_t \quad (15)$$

Wherein:

SR is the slew rate;

$C_t = C_1 + C_2$;

$I_c$ is the DC bias current to flow through the first stage amplification elements.

Our experiments have revealed it difficult to improve the SR drastically even with another structure of the amplifier A. In order that the automatic control loop may properly operate, it is necessary that Equation (15) > Equation (14).

$$I_c > (\sqrt{2}) \cdot 2\pi f \cdot I_x \cdot R_f \cdot C_t \qquad (16)$$

In the case of $Z_x = R_r = R_f = 50\Omega$, $I_x = 50$ mA, $f = 50$ MHz and $C_t = 20$ pF, for example, the following relation has to hold.

$$I_c > 22 \text{ mA}$$

In order to make possible the measurement of a high frequency and a high current, as has been described hereinbefore, it is necessary to minimize the $R_f$ and to sufficiently maximize the DC bias current $I_c$ flowing through the first stage of the amplifier A. In case an FET is used at the first stage of the amplifier A, the DUT cannot be properly measured in the high frequency and with the large current because the $I_c$ is limited by the $I_{DSS}$ of the FET. If, on the other hand, the $I_c$ is increased, the noise $I_n$ is augmented irrespective of the frequency.

The description thus far made could be summarized in the following form. In case that the $BT_r$ is used at the first stage of the amplifier A, the current measurement noise when a large impedance is to be measured is increased as seen from Equation (10) for a high DC bias current $I_c$. For a low bias current $I_c$, on the other hand, the SR necessary for measurements with the high current and the high frequency is sufficiently short as may be seen from Equation (16) so that the automatic control loop is sufficiently destabilized to make the measurements impossible. Moreover, the FET is improper for the DUT of a low impedance or for the measurements with high frequency and high current.

In the case of the products of the prior art, both the $BT_r$ and the FET are used at the first stage of the amplifier A. However, the bias current value is fixed at a suitable compromising value so that the $E_n$ and the $I_n$ are not proper for the measurements of the DUT having a certain impedance. Thus, a compromise has to be made for the increase in noise for the measurement of the $I_x$, and high-frequency and large-current measurements cannot be accomplished.

It is, therefore, an object of the present invention is to solve the above-specified problems by a circuit element measuring apparatus which executes high-frequency and large-current measurements precisely by controlling the amplifier A.

SUMMARY OF THE INVENTION

In accordance with the foregoing and other objects of the invention, a method and apparatus are provided wherein a circuit element measuring apparatus for a device under test having one terminal and another terminal comprises a source of measurement voltage, means for detecting the measurement voltage, a zero detection amplifier, and a voltage-controlled source for drawing an electric current through the device to be measured in accordance with the output of the zero detection amplifier so as to drop the voltage of the other terminal of the device to be measured to zero.

In accordance with this invention, means are provided for changing the operation point of the zero detection amplifier in response to a measured condition. Preferably, the operation point is the operating current of a first stage semiconductor element of the zero detection amplifier. The measuring condition is selected from a group consisting of the impedance of the device to be measured, feedback resistance of the zero detection amplifier, a measuring frequency, and a measuring current through the device.

DETAILED DESCRIPTION OF A PREFERRED EMBODIMENT

Figure 4:
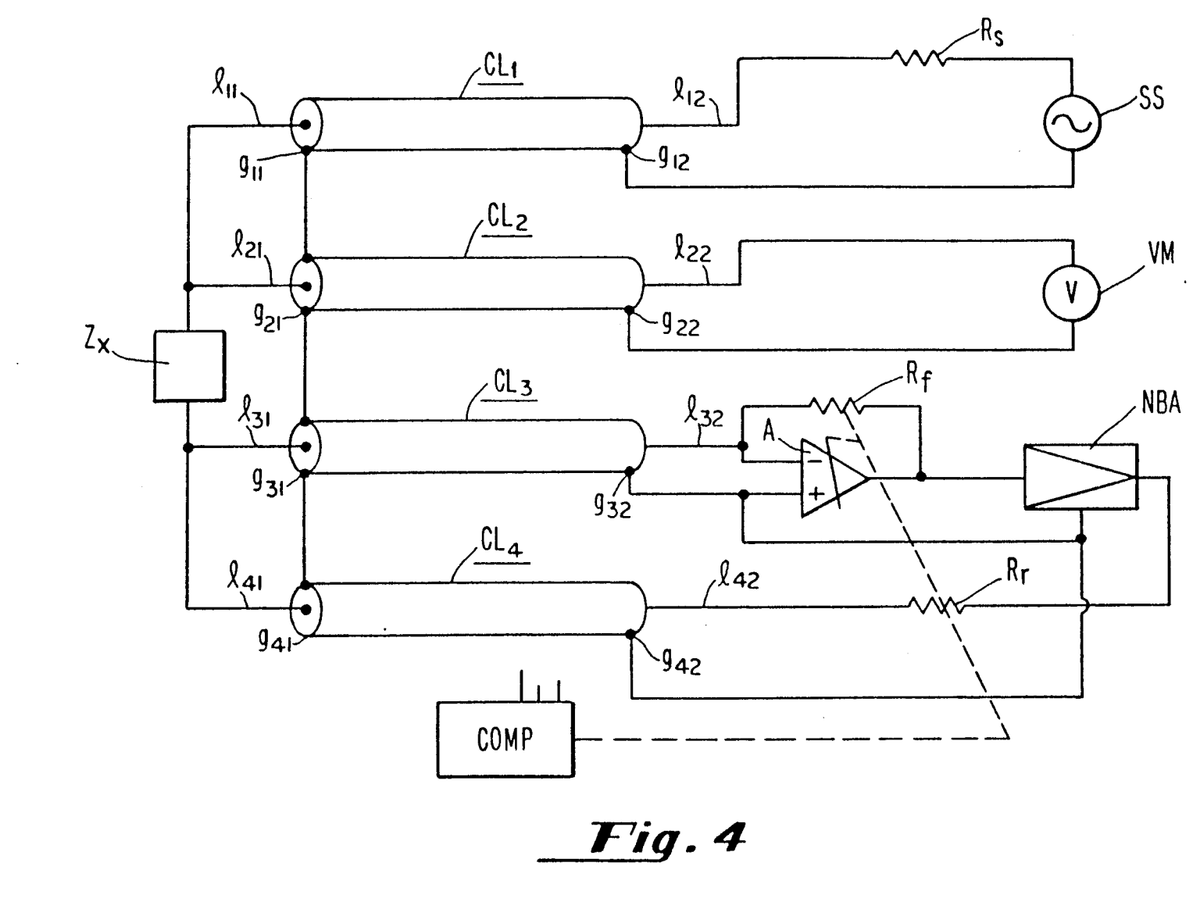
FIG. 4 is a schematic circuit diagram showing the circuit element measuring apparatus according to one embodiment of the present invention.

FIG. 4 is a schematic circuit diagram showing one embodiment of the present invention. The structure of the amplifier A used in FIG. 4 is shown in FIG. 3 where the parts serving the same functions are designated with common reference characters. FIG. 4 is different from FIG. 3 in that there is newly provided a control circuit block COMP. Note, however, that the prior art circuit element measuring apparatus of FIG. 1, according to the prior art is also equipped with a control not shown in FIG. 1. However, the function of setting the operation point of the amplifier A by setting the current I° in response to the control circuit COMP is not practiced by the prior art.

In the embodiment of the present invention, the DC bias current $I_c$ of the first stage amplification element $T_r$ for the amplifier A is controlled in the following manner. First of all, the range resistance $R_r$ is determined if the impedance $Z_x$ of the DUT, the measurement current $I_x$ and the measurement frequency f are given. Since the voltage to be generated in the range resistance $R_r$ is limited to the maximum $V_{max}$, the resistance $R_r$ selects a value smaller than $V_{max}/I_x = R_{rmax}$ and near $R_{rmax}$. The resistance $R_f$ selected is near the selected value of the $R_r$. The allowable range ($I_{c1}$, $I_{c2}$) is given by Equation (10).

Next, with the known capacity $C_t$ of the transistor $T_r$, the minimum $I_{cmin}$ of the allowable $I_c$ is given from Equation (16).

The values $I_{c1}$, $I_{c2}$ and $I_{cmin}$ are written into the following equations.

$$I_{c1} = 0.025/2 \times |R_r//R_f|/|Z_x//R_f| [A] \qquad (18)$$

$$I_{c1} = 0.050 = h_{FE}/|R_r//R_f| [A] \qquad (19)$$

$$I_{cmin} = 2\sqrt{2} \cdot \pi f I_x R_f C_t [A] \qquad (20)$$

Equation (10) is written into the following form.

$$I_{c1} < I_c < I_{c2}.$$

The setting of the $I_c$ is determined to satisfy at least the Equation (16). In case, moreover, the $I_c$ can satisfy the Equation (10), it is set at that value. Otherwise, the $I_c$ is set at the minimum to satisfy the Equation (16) so that the value $I_n$ may be minimized.

In case a DUT of $Z_x = 10$ K$\Omega$, for example, is to be measured with a low frequency, the $I_c$ may be set at about 1 mA from the Equation (12). In case, on the other hand, a DUT of $Z_x = 50\Omega$ is to be measured for $I_x = 50$ mA and F = 50 MHz, the measurements can be performed for $I_c = 22$ mA from Equation (17) without deterioration of the stability of the automatic control loop.

In the embodiment thus far described, no special consideration is taken into the sections of the $R_r$, $R_f$, $I_x$ and f, which can be economically limited to discrete values.

In case the value $Z_x$ is unknown, on the other hand, there can be easily conceived convenient means for determining the value $I_c$ by advancing the computations assuming that the value $Z_x$ be equal to the value $R_r$. It is also conceivable to reduce the values $C_1$ and $C_2$ (by raising the collector voltage) so as to increase the value SR.

Since the operation point of the transistor $T_r$ is determined by the collector voltage and the collector current, the slew rate SR is increased by increasing either the collector voltage or the collector current. Thus, the object of the present invention is satisfied by raising the collector voltage with a high frequency. In this case, the power consumption of the transistor $T_r$ is increased.

It will be appreciated that the control circuit COMP may comprise a microprocessor capable of the aforesaid computations in response to the measuring conditions of the impedance ($Z_x$), the feedback resistance ($R_x$), a measuring frequency (f) or a measuring current $I_x$ for changing the operating point of the amplifier A, e.g., the current $I_c$.

As has been described in detail hereinbefore, according to the embodiment of the present invention, the measurement accuracy and stability of the current $I_x$ to flow through the DUT can be improved. As a result, the accuracy and stability of the circuit element measurements are also improved. This result is achieved because the slew rate of the amplifier A sufficiently stabilizes the automatic control loop for measuring the value of $I_x$ and because the influence of noise on the amplifier A are reduced.

We claim:

1. A circuit element measuring apparatus for a device having one terminal and another terminal, said apparatus comprising:
    a signal source;
    a first line connecting said one terminal to said signal source for applying a voltage to said terminals;
    a volt meter;
    a second line connecting said one terminal to said volt meter for measuring said voltage applied to said one terminal;
    a zero detection amplifier;
    a third line connecting the other terminal of said element to said zero detection amplifier for detecting the voltage of said other terminal;
    a voltage controlled source;
    a fourth line for connecting said other terminal with said voltage control source for drawing an electric current flowing through said element in accordance with the output of said zero detection amplifier so as to drop the voltage of said other terminal to zero;
    and means for changing the operation point of the zero detection amplifier in accordance with a measuring condition of said measuring apparatus.

2. The circuit element measuring apparatus of claim 1 wherein said measuring condition includes the impedance of the element to be measured.

3. The circuit element measuring apparatus of claim 1 wherein said measuring condition is a feedback resistance of said zero detection amplifier.

4. The circuit element measuring apparatus of claim 1 wherein said measuring condition includes a measuring frequency.

5. The circuit element measuring apparatus of claim 1 wherein said measuring condition includes the measuring current through the device.

6. The circuit element measuring apparatus of claim 1 wherein said measuring condition is selected from a group consisting of the impedance of the device to be measured, a feedback resistance of the zero detection amplifier, a measuring frequency and a measuring current through the DUT.

7. The circuit element measuring apparatus of claim 1 wherein said zero detection amplifier includes a first stage having a semiconductor element and the means for changing the operation point changes the operation current through said semiconductor element.

8. A circuit element measuring apparatus for a device under test having one terminal and another terminal, said apparatus comprising:
    means for applying a measurement voltage to one terminal of said device;
    means for detecting the measurement voltage applied to said one terminal of said device;
    zero detection amplifier means coupled to the other terminal of said device for detecting the voltage at said other terminals;
    a voltage controlled current source for drawing an electric current through said element in accordance with the output of said zero detection amplifier to drop the voltage of said other terminal to zero;
    shielded line means coupling said device to said means for applying a measurement voltage, said means for detecting the measurement voltage, said zero detection amplifier, and said voltage-controlled current source; and
    means for changing the operation point of said zero detection amplifier in response to a measuring condition of said apparatus.

9. The circuit element measuring apparatus of claim 8 wherein said measuring condition is selected from a group consisting of the impedance of said element to be measured, the feedback resistance of the zero detection amplifier, a measuring frequency and a measuring current through the element to be measured.

10. The circuit element measuring apparatus of claim 8 wherein said zero detection amplifier comprises a first stage having a semiconductor element and said means for changing the operation point of said zero detection amplifier comprises means for changing the operating current of said first stage semiconductor element.

11. A method of operating a circuit device measuring apparatus for a device under test having one terminal and another terminal comprising a source of measurement voltage, means for detecting the measurement voltage, a zero detection amplifier, a voltage controlled current source for drawing an electric current through said device in accordance with the output of said zero detection amplifier to drop the voltage of said other terminal to zero and shielded lines coupled thereto, said method comprising the following steps:

applying a measurement voltage from said source to said one terminal;

detecting the measurement voltage applied to said one terminal by said means for detecting;

detecting the voltage at said other terminal with said zero detection amplifier; and means for changing the operating point of said zero detection amplifier in response to a measuring condition of the apparatus.

12. The method of claim 11 wherein said zero detection amplifier includes a first stage semiconductor element and the step of changing the operating point of said zero detection amplifier includes changing the operating current of said first stage semiconductor element.

13. The method of claim 11 wherein the operating point is changed in accordance with a measuring condition selected from the group consisting of the impedance of the device to be measured, a feedback resistance of the zero detection amplifier, a measuring frequency and a measuring current through the device to be measured.

* * * * *

UNITED STATES PATENT AND TRADEMARK OFFICE
CERTIFICATE OF CORRECTION

PATENT NO.  : 5,086,278
DATED       : February 4, 1992
INVENTOR(S) : Hideki Wakamatsu and Shinya Goto It is certified that error appears in the above-identified patent and that said Letters Patent is hereby corrected as shown below:

Column 1, line 40, change "$1_{22}$" to --$1_{12}$--.

Column 2, line 57, change "$BT_4$" to --$BT_r$--.

Column 2, line 67, change "$10^{31\ 19}$" to --$10^{-19}$--.

Column 3, line 5, change "$f\Delta$" to --$\Delta f$--.

Column 3, line 19, change "$R,$" to --$R_f$--.

Column 3, line 31, change "$I_n + 0$" to --$I_n = 0$--.

Column 3, line 32, change "$E_n + 0$" to --$E_n = 0$--.

Column 3, line 36, change "$(R_r + E_2/R_f)^2)$" to --$(R_r \cdot E_2/R_f)^2)$--.

Column 3, line 62, change "$Z_x = I\Omega$" to --$Z_x = 10\ K\Omega$--.

Column 6, line 29, change "$I^0$" to --$I_c$--.

UNITED STATES PATENT AND TRADEMARK OFFICE
CERTIFICATE OF CORRECTION

PATENT NO. : 5,086,278
DATED : February 4, 1992
INVENTOR(S) : Hideki Wakamatsu and Shinya Goto It is certified that error appears in the above-indentified patent and that said Letters Patent is hereby corrected as shown below:

Column 6, line 52, change "$I_{c1}$" to --$I_{c2}$--.

Signed and Sealed this

Twelfth Day of October, 1993

Attest:

BRUCE LEHMAN

*Attesting Officer*     *Commissioner of Patents and Trademarks*